United States Patent
Jain et al.

(10) Patent No.: US 12,153,804 B1
(45) Date of Patent: Nov. 26, 2024

(54) DATA STORAGE DEVICE AND METHOD FOR SCANNING MEMORY BLOCKS

(71) Applicant: Western Digital Technologies, Inc., San Jose, CA (US)

(72) Inventors: Nitin Jain, Bangalore (IN); Maharudra Nagnath Swami, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 24 days.

(21) Appl. No.: 18/224,845

(22) Filed: Jul. 21, 2023

Related U.S. Application Data (60) Provisional application No. 63/465,297, filed on May 10, 2023.

(51) Int. Cl.
*G06F 12/00* (2006.01)
*G06F 3/06* (2006.01)
*G06F 11/08* (2006.01)
*G11C 16/08* (2006.01)

(52) U.S. Cl.
CPC .......... *G06F 3/0619* (2013.01); *G06F 3/0653* (2013.01); *G06F 3/0679* (2013.01); *G06F 11/08* (2013.01); *G11C 16/08* (2013.01)

(58) Field of Classification Search
CPC .... G06F 3/0619; G06F 3/0653; G06F 3/0679; G06F 11/08; G11C 16/08
USPC ....................................................... 711/103
See application file for complete search history.

(56) References Cited

U.S. PATENT DOCUMENTS

| | | | |
|---|---|---|---|
| 11,462,279 B1* | 10/2022 | Banerjee | G11C 16/26 |
| 2005/0249010 A1* | 11/2005 | Klein | G11C 11/406 |
| | | | 365/222 |
| 2015/0278016 A1* | 10/2015 | La Fetra | G06F 11/10 |
| | | | 714/766 |
| 2016/0141047 A1* | 5/2016 | Sehgal | G11C 16/349 |
| | | | 365/185.02 |
| 2020/0005874 A1* | 1/2020 | Shappir | G11C 16/26 |
| 2020/0118636 A1* | 4/2020 | Athreya | G11C 16/26 |

FOREIGN PATENT DOCUMENTS

| | | | | | |
|---|---|---|---|---|---|
| GB | | 2514611 A | * | 12/2014 | .......... G06F 11/0727 |
| WO | WO-2015167509 A1 | | * | 11/2015 | .......... G06F 11/1076 |

* cited by examiner

*Primary Examiner* — Mardochee Chery
(74) *Attorney, Agent, or Firm* — Crowell & Moring LLP (57) ABSTRACT

Some areas (e.g., boundary wordlines) in a block of memory can be more error prone than others. Typically, errors in these areas are not detected until after the entire block is programmed. Handling such errors then can result in performance penalties and large data relocations. With the embodiments presented herein, a two-stage programming operation is provided. In the first stage, only the error-prone areas of the block are programmed, and a check is made to determine if an error occurred in that programming. In the second stage, the remaining portions of the block are programmed, but that only occurs after it is determined that the error-prone areas have been programmed successfully. Detecting and dealing with errors in the error-prone areas before the entire block is programmed avoid the performance penalties and large data relocations noted above.

20 Claims, 9 Drawing Sheets

| WL Number | String 0 | String 1 | String 2 | String 3 | String 4 | WL Regioning |
|---|---|---|---|---|---|---|
| WL-0 | | | | | | Region-1 (BWL) |
| WL-1 | | | | | | Region-2 (Upper non-BWL region) |
| WL-2 | | | | | | Region-2 (Upper non-BWL region) |
| ⋮ | | | | | | Region-2 (Upper non-BWL region) |
| WL-79 | | | | | | Region-2 (Upper non-BWL region) |
| WL-80 | | | | | | Region-3 (BWL-region around the joint) |
| WL-81 | | | | | | Region-3 (BWL-region around the joint) |
| WL-82 | | | | | | Region-4 (Lower non-BWL region) |
| WL-83 | | | | | | Region-4 (Lower non-BWL region) |
| ⋮ | | | | | | Region-4 (Lower non-BWL region) |
| WL-160 | | | | | | Region-4 (Lower non-BWL region) |
| WL-161 | | | | | | Region-5 (BWL) |

DATA STORAGE DEVICE AND METHOD FOR SCANNING MEMORY BLOCKS

CROSS-REFERENCE TO RELATED APPLICATION

This application claims priority to U.S. provisional patent application No. 63/465,297, filed May 10, 2023, which is hereby incorporated by reference.

BACKGROUND

Boundary wordline defects are common in some memories, such as three-dimensional NAND flash memories. The probability of such problems is even greater in lower-grade memories due to relaxed screening during memory testing. To address this problem, a few wordlines at the edges (e.g., top, bottom, around the middle joint) of a block can be marked as "dummy" wordlines during the design of the memory. These dummy-marked wordlines would not be available to store data and, as such, can help avoid the boundary wordline defect issue to a certain extent.

DETAILED DESCRIPTION

The following embodiments generally relate to a data storage device and method for scanning memory blocks to improve yield and performance. In one embodiment, a data storage device is provided comprising a controller and a memory comprising at least one error-prone area and at least one other area that is less error prone. The controller is configured to: program data into the at least one error-prone area of the memory; determine whether an error occurred in programming the data into the at least one error-prone area of the memory; and in response to determining that the error did not occur in programming the data into the at least one error-prone area of the memory, program additional data into the at least one other area of the memory.

In another embodiment, a method is provided that is performed in a data storage device comprising a memory. The method comprises: prior to performing a full programming operation in a block of the memory: programming data in only a part of the block; and determining whether an error occurred in programming the data in the part of the block; wherein the full programming operation is performed in the block only in response to determining that the error did not occur in programming the data in the part of the block.

In yet another embodiment, a data storage device is provided comprising: a memory; and means for programming the memory in two stages, wherein: in a first stage, data is programmed into one or more one error-prone regions of the memory and a determination is made as to whether an error occurred in programming the data into the one or more one error-prone regions of the memory; and in a second stage, additional data is programmed into one or more one additional regions of the memory only after the determining that the error did not occur in programming the data into the one or more one error-prone regions of the memory.

Other embodiments are possible, and each of the embodiments can be used alone or together in combination. Accordingly, various embodiments will now be described with reference to the attached drawings.

Embodiments

The following embodiments relate to a data storage device (DSD). As used herein, a "data storage device" refers to a device that stores data. Examples of DSDs include, but are not limited to, hard disk drives (HDDs), solid state drives (SSDs), tape drives, hybrid drives, flash drives etc. Details of example DSDs are provided below.

Figures 1A, 1B:
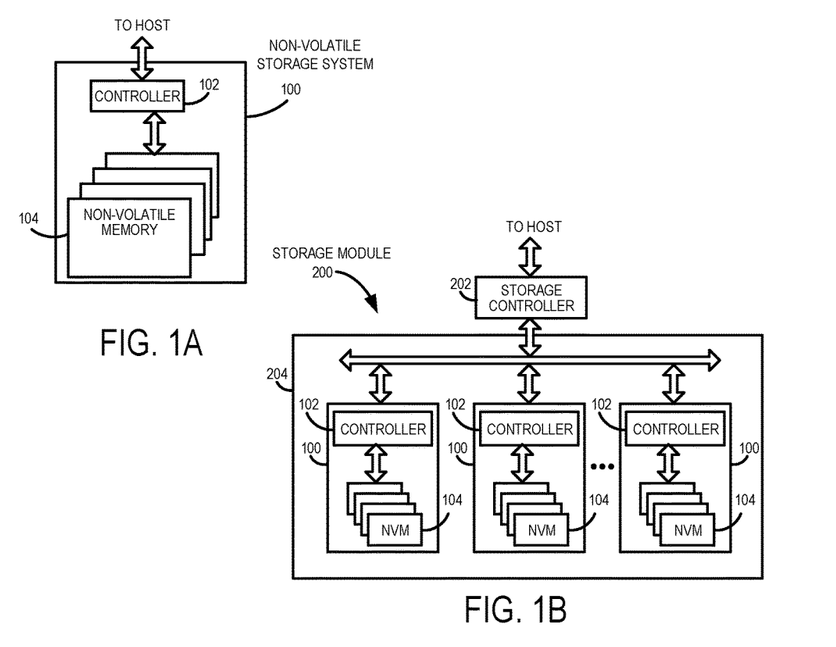
FIG. 1A is a block diagram of a data storage device of an embodiment.
FIG. 1B is a block diagram illustrating a storage module of an embodiment.
Figure 1C:
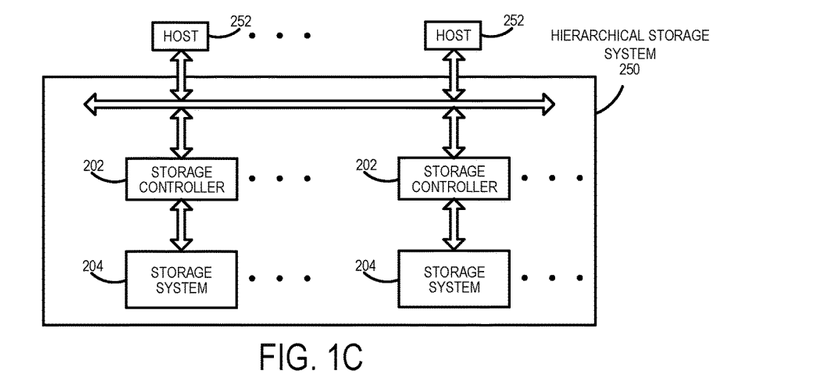
FIG. 1C is a block diagram illustrating a hierarchical storage system of an embodiment.

Data storage devices suitable for use in implementing aspects of these embodiments are shown in FIGS. 1A-1C. FIG. 1A is a block diagram illustrating a data storage device 100 according to an embodiment of the subject matter described herein. Referring to FIG. 1A, data storage device 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCOE) interface. In one embodiment, the system illustrated in FIG. 1C may be a rack mountable mass storage system that is accessible by multiple host computers, such as would be found in a data center or other location where mass storage is needed.

Figure 2A:
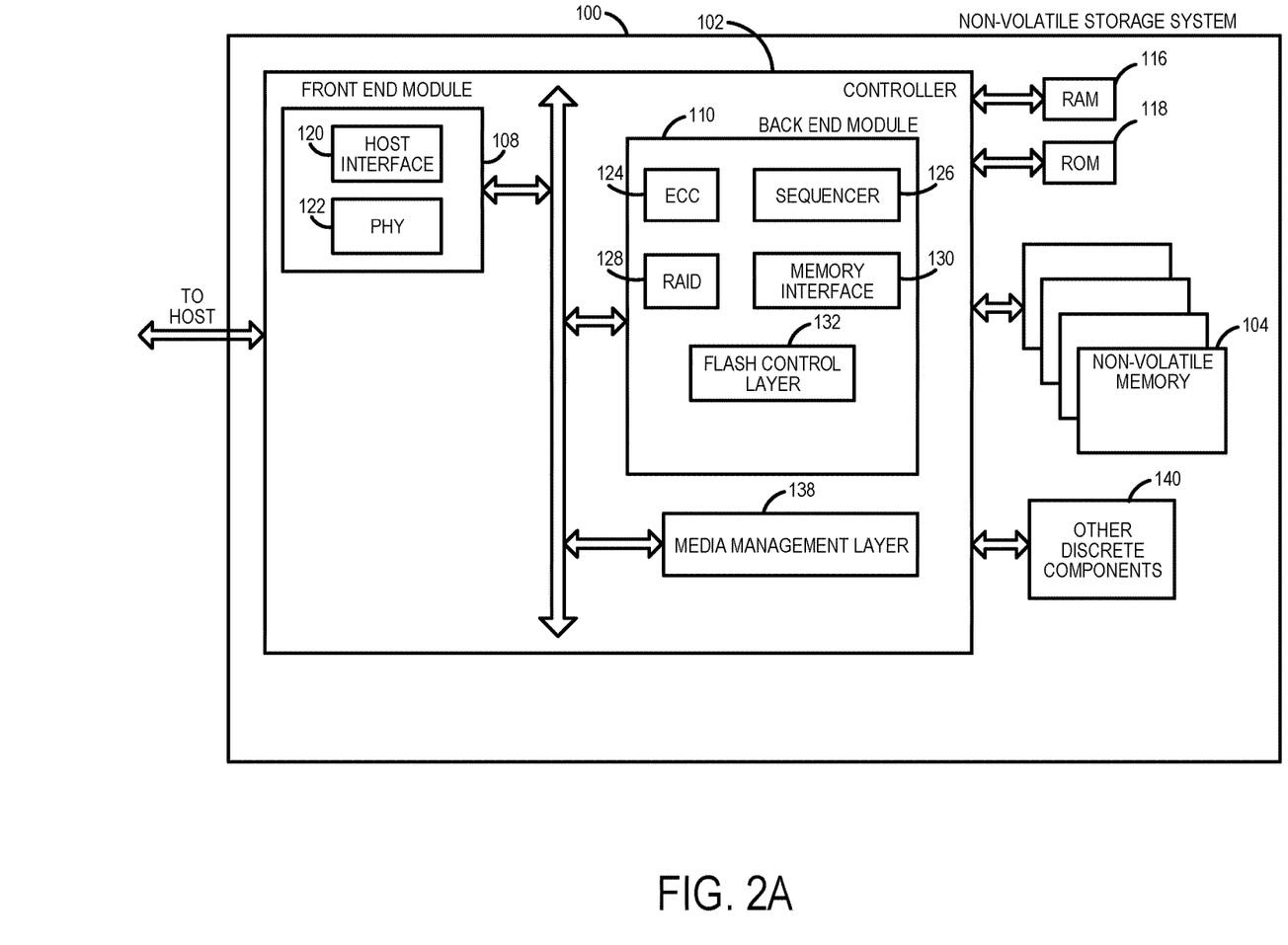
FIG. 2A is a block diagram illustrating components of the controller of the data storage device illustrated in FIG. 1A according to an embodiment.

FIG. 2A is a block diagram illustrating components of controller 102 in more detail. Controller 102 includes a front-end module 108 that interfaces with a host, a back-end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro) processor or processing circuitry that usually performs a particular function of related functions, or a self-contained hardware or software component that interfaces with a larger system, for example. Also, "means" for performing a function can be implemented with at least any of the structure noted herein for the controller and can be pure hardware or a combination of hardware and computer-readable program code.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
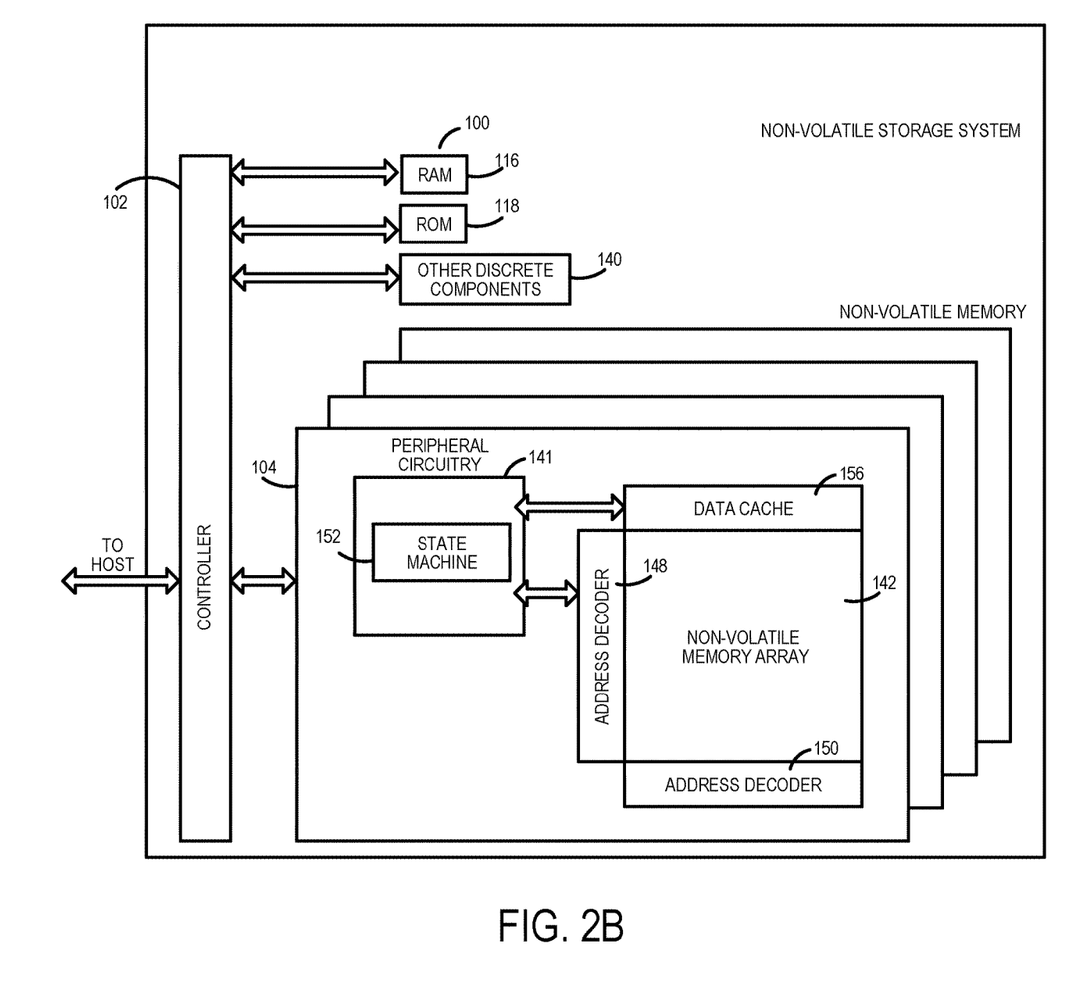
FIG. 2B is a block diagram illustrating components of the memory data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
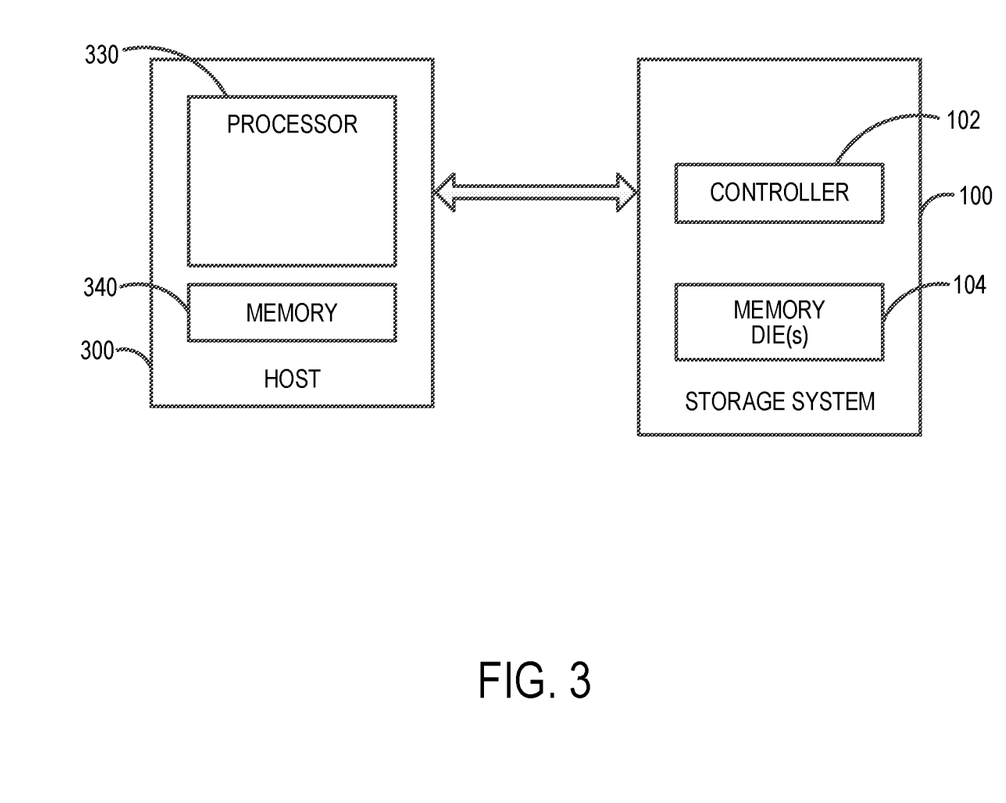
FIG. 3 is a block diagram of a host and data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises a processor 330 and a memory 340. In one embodiment, computer-readable program code stored in the host memory 340 configures the host processor 330 to perform the acts described herein. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

As mentioned above, boundary wordline (BWL) defects are common in some memories, such as three-dimensional NAND flash memories. As the three-dimensional NAND flash memory generation is reaching higher layers (e.g., 48 wordlines in BiCS2, 64 wordlines in BiCS3, 96 wordlines in BiCS4, 112 wordlines in BiCS5, 162 wordlines in BiCS6, etc.), the manufacturing processes are becoming increasingly complex. Boundary wordline defects continue to call for several defect-handling provisions in memory and firmware systems. The probability of such problems is even greater in lower-grade memories due to relaxed screening during memory testing. Lower-grade memories (specifically, error-prone wordlines in those memories) exhibit several issues (e.g., silent failures, slow-to-program cells, and slow-to-erase cells) that are generally tackled using sophisticated firmware schemes. On other hand, the growth in bit-density per cell is allowing each memory block to hold more and more data (e.g., a quad-level cell (QLC) holds four bits per memory cell). On the downside, packing more bits per cell impacts data program and sense times, thereby impacting device performance. Whenever there is a program or read failure in QLC blocks, for example, the system can enter error-handling paths that can significantly impact system performance.

Lower-grade memories can have an even higher chance of wordline-related failures (e.g., boundary wordline failures). Unfortunately, no effective and proactive defect-check (scan) mechanism exists that can catch program and read failures on such error-prone wordlines before the data programming operation starts. For example, the handling of boundary wordline defect problems can include marking a few wordlines at the edges (e.g., top, bottom, around the middle joint) of a block as "dummy" wordlines during the memory design itself. These dummy-marked wordlines would not be available to store host data and, as such, can help avoid the boundary wordline defect issue to a certain extent. However, this approach reduces memory capacity and still does not guarantee defect-free boundary wordlines, as wordlines that are next to the dummy wordlines themselves may be subject to the defect problem.

The following embodiments provide an effective scheme to pre-scan boundary wordlines on blocks of the memory 104 (e.g., QLC host blocks), as well as methods that can be used during a block programming operation. These embodiments can be, but do not have to be, used in combination with techniques that mark boundary wordline as "dummy" wordlines to help avoid a performance penalty during block programming operations.

Figure 4:
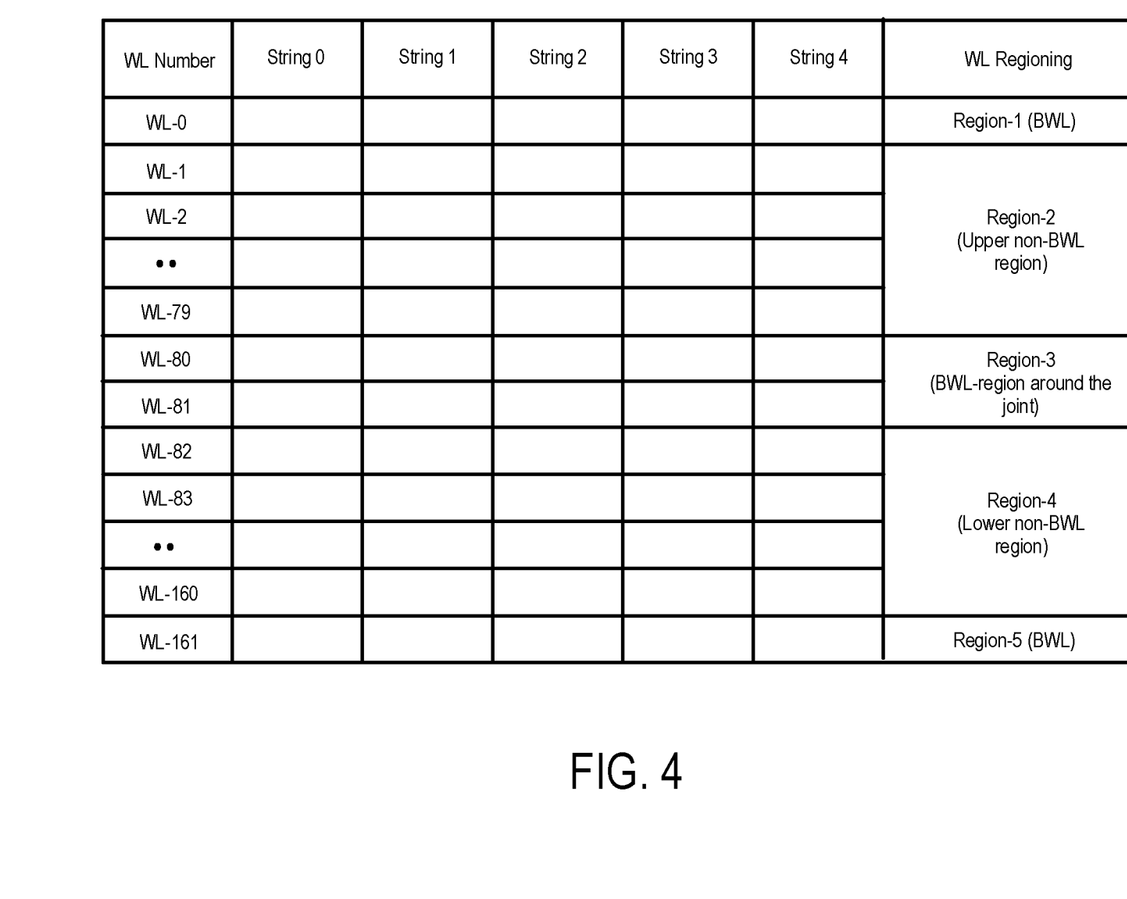
FIG. 4 is an illustration of a memory of an embodiment in which a plurality of wordline regions are segregated into boundary-wordline regions and non-boundary-wordline regions.

In one embodiment (see FIG. 4), a block (e.g., a QLC block) in the memory 104 is logically partitioned into a plurality of wordline regions segregating boundary-wordline regions and non-boundary-wordline regions. As shown in FIG. 4, in this embodiment, this "logical region-ing" results in three boundary-wordline regions (Region 1 (WL-0) and Region 5 (WL-161) at the top and bottom of the block, respectively, and Region 3 (WL-80 and WL-81) around the joint of the block), as well as two non-boundary-wordline regions (Region 2 (WL-1 to WL-79) and Region 4 (WL-82 to WL-160), which are upper and lower regions, respectively, with respect to Region 3).

Figure 5:
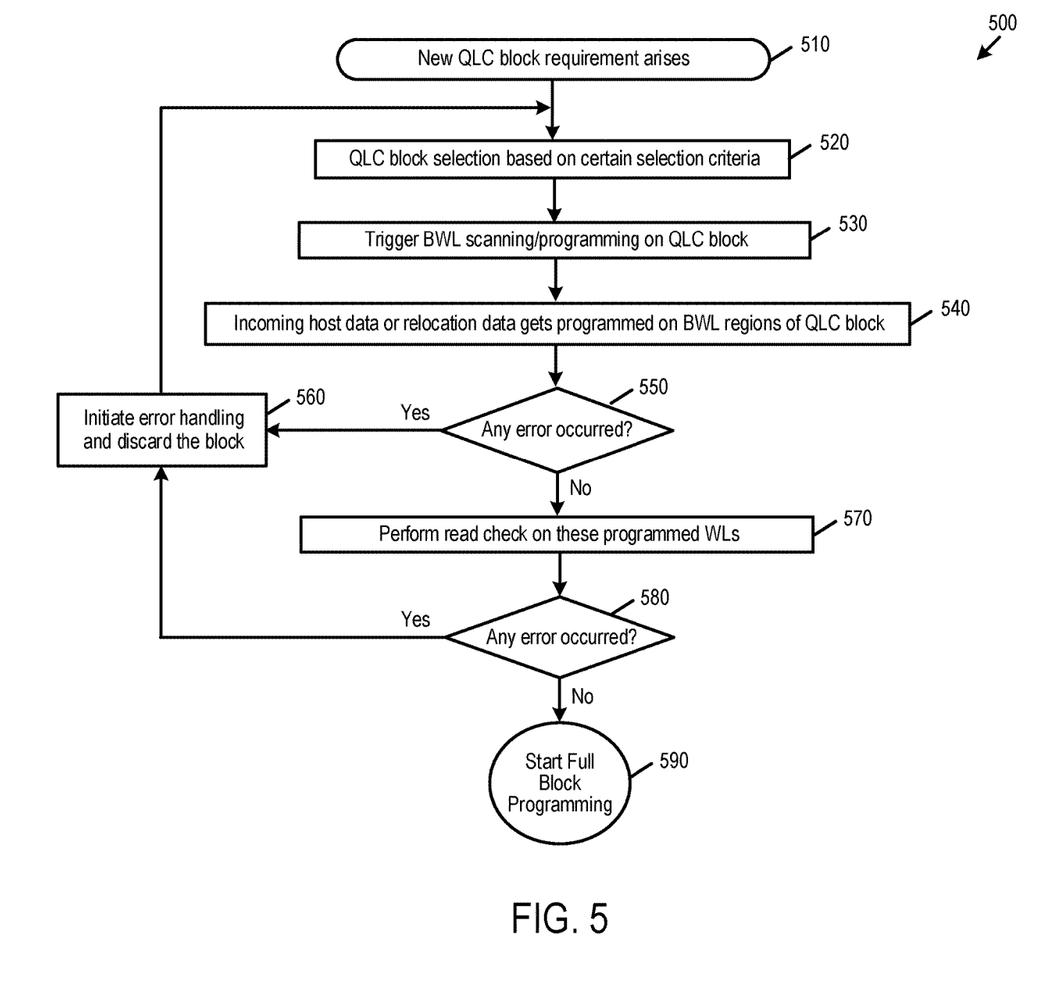
FIG. 5 is a flow chart of a boundary wordline scan/programming method of an embodiment.
Figure 6:
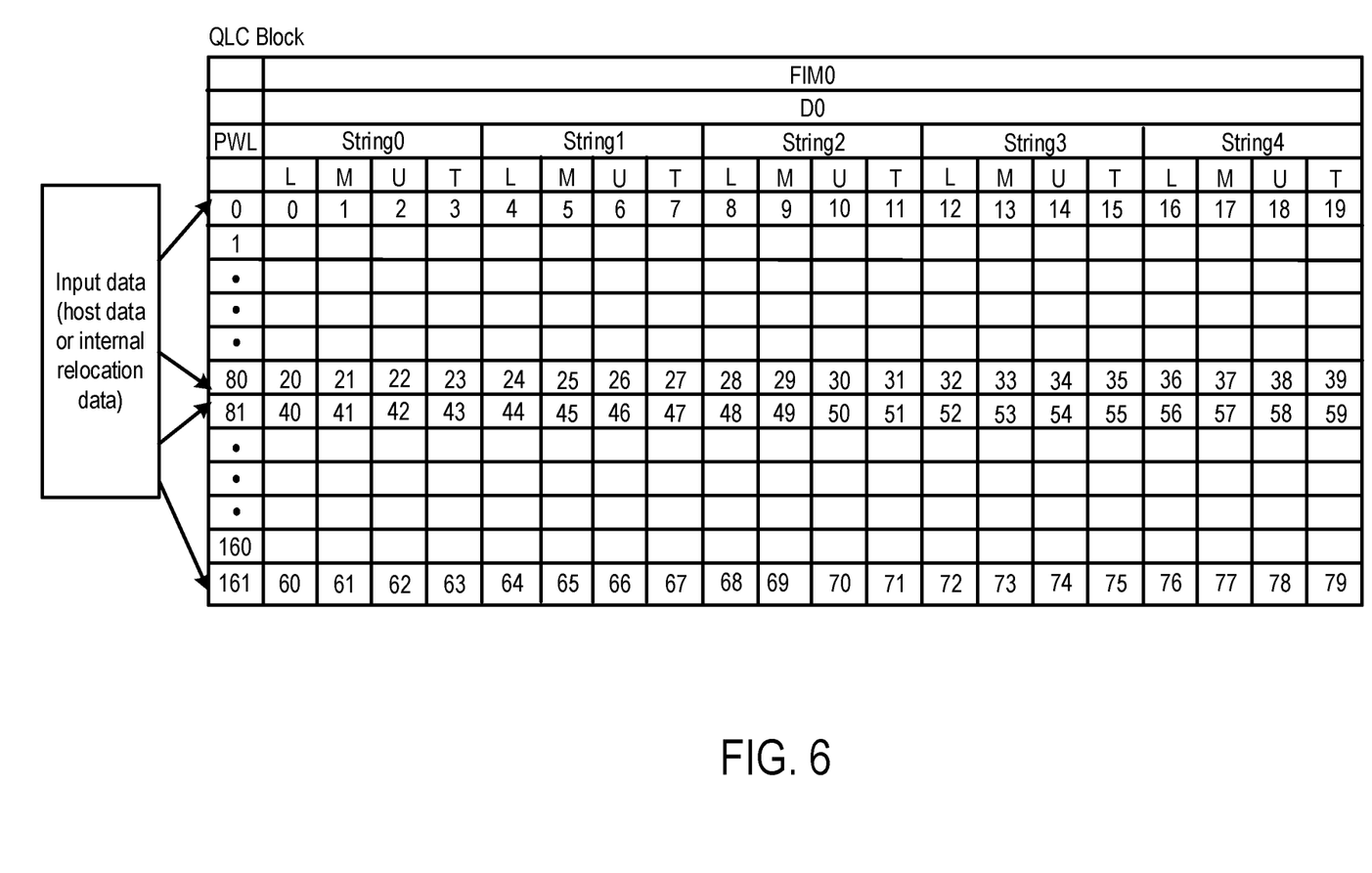
FIG. 6 is an illustration of a memory of an embodiment after performing a boundary wordline scan/programming method.

With reference to the flow chart 500 in FIG. 5, when there is a need for a new open block (e.g., a QLC block) for writing host data or internal data movement ("relocation data") (act 510), the controller 120 selects a new block based on any suitable certain selection criteria (e.g., the lowest program-erase count/the coldest block) (act 520). Next, the controller 102 triggers a boundary wordline scanning/programming operation on the block (act 530). In this operation, incoming host data or relocation data gets programmed on the boundary wordline regions of the QLC block first (act 540). As shown in FIG. 6, in this example, Region 1 (WL-0), Region 3 (WL-80 and WL-81), and Region 5 (WL-161) are programmed.

The controller 102 then determines if an error occurred in the programming of those boundary wordline regions (act 550). If an error occurred, the controller 102 initiates an error handling and data recovery operation on the programmed boundary wordlines and discards the block (act 560), after which the method loops back to act 520. However, if no error occurred on the programming of the boundary wordline regions, the controller 102 performs a read check by reading the boundary wordline regions (act 570) to determine if the programmed data is what was intended to be programmed in the boundary wordline regions (e.g., using an enhanced post-write read (EPWR), by using the parity bits stored with the data to see if an error is present, etc. (act 580). If the read check passes (no error occurred), the controller 102 initiates an error handling and data recovery operation and discards the block (act 560), after which the method loops back to act 520. However, if no error occurred, the controller 102 starts the full programming of the non-boundary wordlines in the block (act 590).

It should be noted that some memories (e.g., some three-dimensional NAND memories) may not allow reading of a partially or sparsely-written block. In such memories, acts 570 and 580 can be skipped, so act 590 would be performed after determining that no error occurred in act 550.

Figure 7:
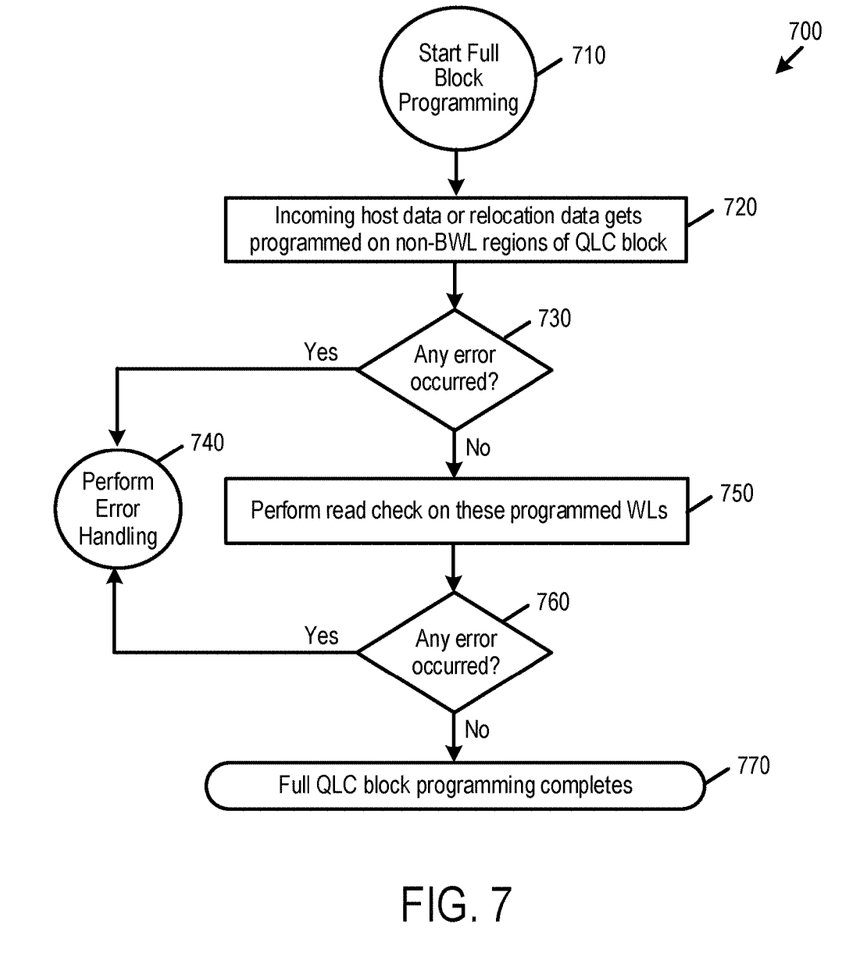
FIG. 7 is a flow chart of data programming method of an embodiment.
Figure 8:
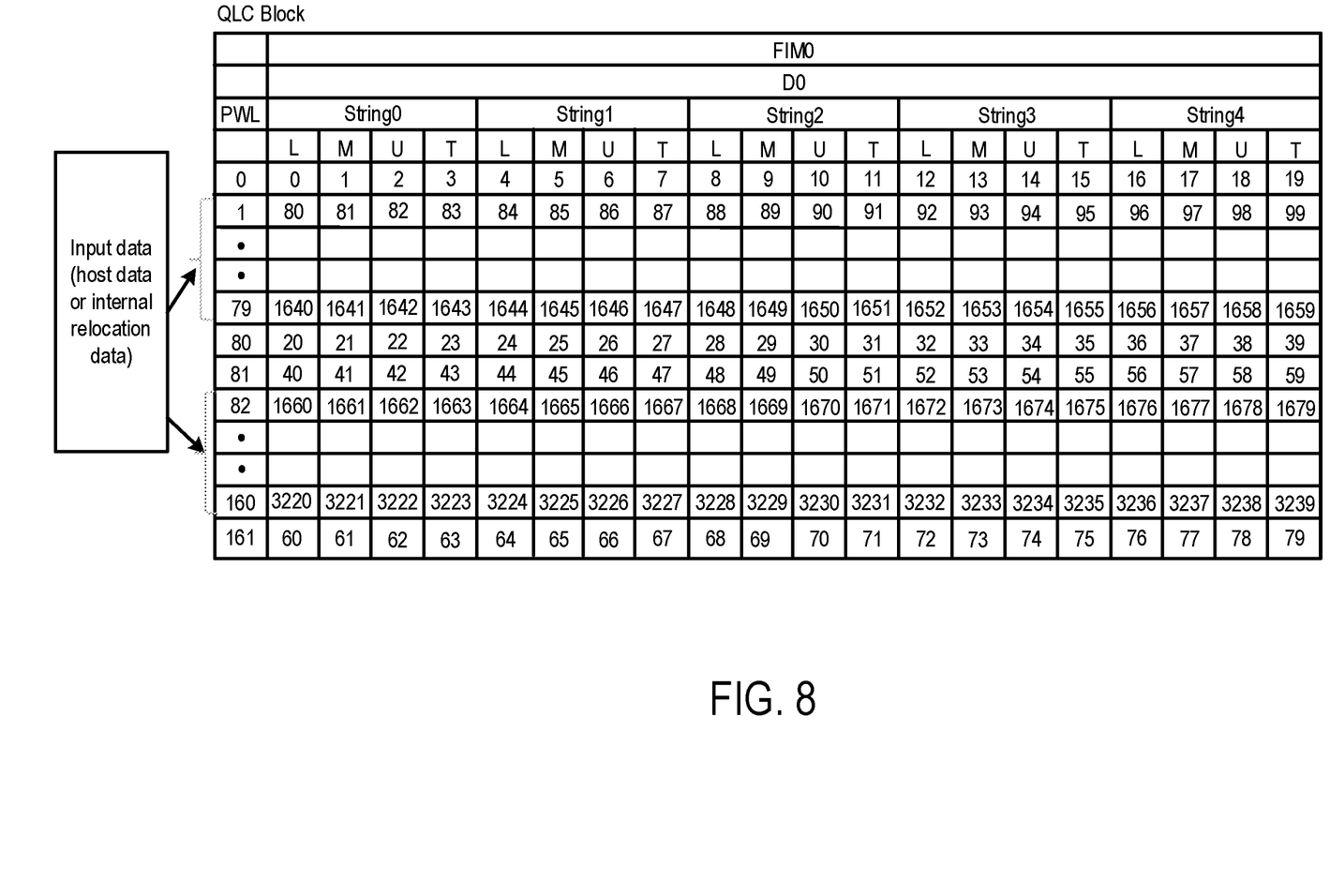
FIG. 8 is an illustration of a memory of an embodiment after programming.

FIG. 7 is a flow chart 700 that illustrates the full programing operation of the non-boundary wordlines in the block in more detail. As shown in FIG. 7, after the start of the full programing operation (act 710), the controller 102 programs incoming host data or relocation data on non-boundary-wordline regions of the QLC block (act 720). As shown in FIG. 8, in this example, Region 2 (WL-1 to WL-79) and Region 4 (WL-82 to WL-160) are programmed. After the QLC block is fully programmed, the controller 102 determines if an error occurred in programming the non-boundary-wordline regions of the QLC block (e.g., any error occurred? act 730) . . . . If an error occurred while programming, an error handling process is performed (act 740). However, if an error in programming did not occur, the controller 102 performs a read check on the programmed wordlines (act 750) and determines if the programmed data is correct (e.g., if an error occurred) (act 760). If an error occurred, the error handling process is performed (act 740). However, if an error did not occur, the full QLC block programming is complete (act 770).

In summary, with these embodiments, the QLC block programming is staged in two phases, where the first phase covers pre-scan/data programming into boundary-wordline BWL regions (or error-prone wordlines/regions in the block), and the second phase covers data programming into non-boundary-wordline regions (or less-error prone wordlines/regions in the NAND block). As boundary wordline scanning and programming are achieved together within a single phase, these embodiments do not add overhead on system performance.

It should be noted that the above illustrations are merely examples, and the details presented therein should not be read into the claims unless expressly recited therein, as many alternatives can be used. For example, known patterns (e.g., field burn-in type patterns) can be written instead of known data, which may allow for a better check of the wordlines. Also, while a BiCS6 (162 wordlines) node was used in the example, there embodiments can be used with other memory technologies, including, but not limited to, BiCS4, BICS5, BiCS8 BiCS9, etc. Also, while QLC was used in the example, these embodiments can be used with any number of bits per memory cell, including, but not limited to, a single-level cell (SLC), a multi-level cell (MLC) (i.e., two-bits per cell), a triple level cell (TLC), a penta-level cell (PLC), etc.

Further, while boundary wordlines were used in the example, it should be understood that these embodiments can be used with any error-prone wordlines or region (not necessarily on a boundary of a block). If memory/device characterization indicates wordlines other than boundary wordlines are also prone to errors (e.g., caused be defects), these embodiments can be adapted to those wordlines or regions as well. More generally, these embodiments can be configurable for any set of wordlines, string lines, pages, etc. as input and in any possible combination. Also, the "regioning" and/or the pre-scanning method for xLC blocks can be used in many firmware architectures (e.g., direct-write architectures, folding architectures, etc.)

Additionally, the activation of these embodiment can be configurable based on memory characteristics and product requirements. For example, with some memories, these embodiments can be used early in the lifespan of the memory (e.g., within the first ~100 program-erase cycles (PEC)). By using these embodiments during run-in of the memory (for the first several cycles only), the embodiments can uncover whether the boundary wordline is good or bad and can be marked as such. However, these embodiments can also be used later in the memory's lifespan (e.g., at a PEC count of ~500) when the reliability of the memory can start to degrade. With some memories, these embodiments can be configured for use throughout the lifespan of the memory.

There are several advantages associated with these embodiments. For example, these embodiments can be used to identify several issues (e.g., silent program failures, slow-to-program cells and slow-to-erase cells) on error-prone boundary wordlines or boundary-wordline regions before a full-block programming operation starts. This successful early-detection of boundary-wordline defects in xLC blocks avoids heavy performance penalties and large data relocations if those failures were to discovered during a full block programming operation. Further, these embodiments can reduce write-amplification due to reduced relocation, thereby improving device performance and lifespan. Also, as noted above, these embodiments are customizable can be used with any suitable memory type. When used with lower-cost, lower-reliability memories, these embodiments can improve yield and consumption of those memories. However, as also noted above, these embodiments are not limited to use with lower-cost memories.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention.

It is only the following claims, including all equivalents, that are intended to define the scope of the claimed invention. Finally, it should be noted that any aspect of any of the embodiments described herein can be used alone or in combination with one another.

What is claimed is:

1. A data storage device comprising:
   a memory comprising at least one error-prone area and at least one other area that is less error prone; and
   a controller coupled with the memory and configured to:
      program data into the at least one error-prone area of the memory;
      determine whether an error occurred in programming the data into the at least one error-prone area of the memory; and
      in response to determining that the error did not occur in programming the data into the at least one error-prone area of the memory, program additional data into the at least one other area of the memory.

2. The data storage device of claim 1, wherein the controller is further configured to:
   in response to determining that the error did not occur in programming the data into the at least one error-prone area of the memory, perform a read check on the data programmed in the at least one error-prone area of the memory;
   wherein the additional data is programmed into the at least one other area of the memory in response to passing the read check.

3. The data storage device of claim 1, wherein the controller is further configured to:
   determine whether an error occurred in programming the additional data into the at least other area of the memory; and
   in response to determining that the error did not occur in programming the additional data into the at least other area of the memory, perform a read check on the additional data programmed into the at least other area of the memory.

4. The data storage device of claim 3, wherein the read check is also performed on the data programmed in the at least one error-prone area of the memory.

5. The data storage device of claim 1, wherein the controller is further configured to:
   perform an error handling operation in response to determining that the error occurred in programming the data into the at least one error-prone area of the memory.

6. The data storage device of claim 1, wherein the data comprises host data, relocation data, and/or a predetermined pattern of data.

7. The data storage device of claim 1, wherein:
   the at least one error-prone area comprises at least one region of boundary wordlines of a block in the memory; and
   the at least one other area comprises at least one region of non-boundary wordlines of the block in the memory.

8. The data storage device of claim 1, wherein the at least one error-prone area and the at least one other area are part of a quad-level cell (QLC) block.

9. The data storage device of claim 1, wherein the at least one error-prone area comprises at least one wordline, string line, and/or page.

10. The data storage device of claim 1, wherein the memory comprises a BiCSx memory.

11. The data storage device of claim 1, wherein the memory comprises a three-dimensional memory.

12. The data storage device of claim 1, wherein the additional data is programmed in response to a predetermined event, a command from the host, and/or a lifespan of the memory.

13. In a data storage device comprising a memory, a method comprising:
   prior to performing a full programming operation in a block of the memory:
      programming data in only a part of the block; and
      determining whether an error occurred in programming the data in the part of the block;
      wherein the full programming operation is performed in the block only in response to determining that the error did not occur in programming the data in the part of the block.

14. The method of claim 13, wherein the method is performed in response to the program-erase count of the block being under a threshold.

15. The method of claim 13, wherein the method is performed in response to the program-erase count of the block being over a threshold.

16. The method of claim 13, further comprising:
   performing a read check on the data programmed in the part of the block;
   wherein the full programming operation is performed in the block only in response to determining that the read check passed.

17. The method of claim 13, wherein the part of the block comprises at least one error-prone area.

18. The method of claim 13, wherein the part of the block comprises at least one region of boundary wordlines of the block.

19. The method of claim 13, wherein the data programmed in the part of the block comprises host data, relocation data, and/or a predetermined pattern of data.

20. A data storage device comprising:
   a memory; and
   means for programming the memory in two stages, wherein:
      in a first stage, data is programmed into one or more one error-prone regions of the memory and a determination is made as to whether an error occurred in programming the data into the one or more one error-prone regions of the memory; and
      in a second stage, additional data is programmed into one or more one additional regions of the memory only after the determining that the error did not occur in programming the data into the one or more one error-prone regions of the memory.

* * * * *